United States Patent
Hsu et al.

(10) Patent No.: US 9,595,452 B2
(45) Date of Patent: Mar. 14, 2017

(54) RESIDUE FREE OXIDE ETCH

(71) Applicant: Lam Research Corporation, Fremont, CA (US)

(72) Inventors: Chih-Hsun Hsu, Campbell, CA (US); Meihua Shen, Fremont, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/723,348

(22) Filed: May 27, 2015

(65) Prior Publication Data

US 2016/0351418 A1 Dec. 1, 2016

(51) Int. Cl.
*H01L 21/465* (2006.01)

(52) U.S. Cl.
CPC .................. *H01L 21/465* (2013.01)

(58) Field of Classification Search
CPC ......... H01L 21/02063; H01L 21/31116; H01L 21/76224; H01L 21/465
See application file for complete search history.

(56) References Cited

U.S. PATENT DOCUMENTS

| | | | |
|---|---|---|---|
| 6,440,864 B1 * | 8/2002 | Kropewnicki | B08B 7/0035 134/1.2 |
| 2005/0230350 A1 | 10/2005 | Kao et al. | |
| 2010/0093151 A1 | 4/2010 | Arghavani et al. | |
| 2012/0015520 A1 | 1/2012 | Greeley et al. | |
| 2012/0309999 A1 | 12/2012 | Kiehlbauch et al. | |
| 2014/0051227 A1 * | 2/2014 | Jakubowski | H01L 21/31116 438/424 |
| 2014/0080309 A1 | 3/2014 | Park et al. | |

OTHER PUBLICATIONS

S. S Wolf and R.N. Tauber, (Silicon Processing for the VLSI Era, vol. 1—Process Technology, Lattice Press, 1986)(pp. 542-557).*
U.S. Appl. No. 14/495,693 filed on Sep. 14, 2014.

* cited by examiner

*Primary Examiner* — Duy Deo
*Assistant Examiner* — Mahmoud Dahimene
(74) *Attorney, Agent, or Firm* — Beyer Law Group LLP

(57) ABSTRACT

A method for selectively etching silicon oxide is provided. A surface reaction phase is provided comprising flowing a surface reaction gas comprising hydrogen, nitrogen and fluorine containing components to form silicon oxide into a compound comprising silicon, hydrogen, nitrogen, and fluorine, forming the surface reaction gas into a plasma, and stopping the flow of the surface reaction gas. The surface is wet treated to remove the compound.

9 Claims, 9 Drawing Sheets

RESIDUE FREE OXIDE ETCH

BACKGROUND OF THE INVENTION

The present invention relates to the manufacturing of semiconductor devices. More specifically, the invention relates to etching silicon oxide used in manufacturing semiconductor devices.

During semiconductor wafer processing, silicon oxide layers are selectively etched.

SUMMARY OF THE INVENTION

To achieve the foregoing and in accordance with the purpose of the present invention, a method for selectively etching silicon oxide is provided. A surface reaction phase is provided comprising flowing a gas mixture comprising hydrogen, nitrogen and fluorine containing components in plasma to convert silicon oxide into compounds comprising silicon, hydrogen, nitrogen, and fluorine. The surface is wet treated to remove the compound.

In another manifestation of the invention, a method for selectively etching silicon oxide is provided. A dry plasma reaction is provided, comprising a plurality of cycles, wherein each cycle comprises providing a surface reaction phase, comprising flowing a gas comprising $NF_3$ or HF and further comprising $H_2$, $N_2$, or $NH_3$ in a plasma on silicon oxide surface to form a compound comprising silicon, hydrogen, nitrogen, and fluorine, and plasma heating the surface to volatize the compound, comprising flowing a heating gas, wherein the heating gas comprises $H_2$, $N_2$ or $NH_3$, and wherein the heating gas is $NF_3$ and HF free, forming the heating gas in a plasma. The surface is wet treated to remove the compound.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
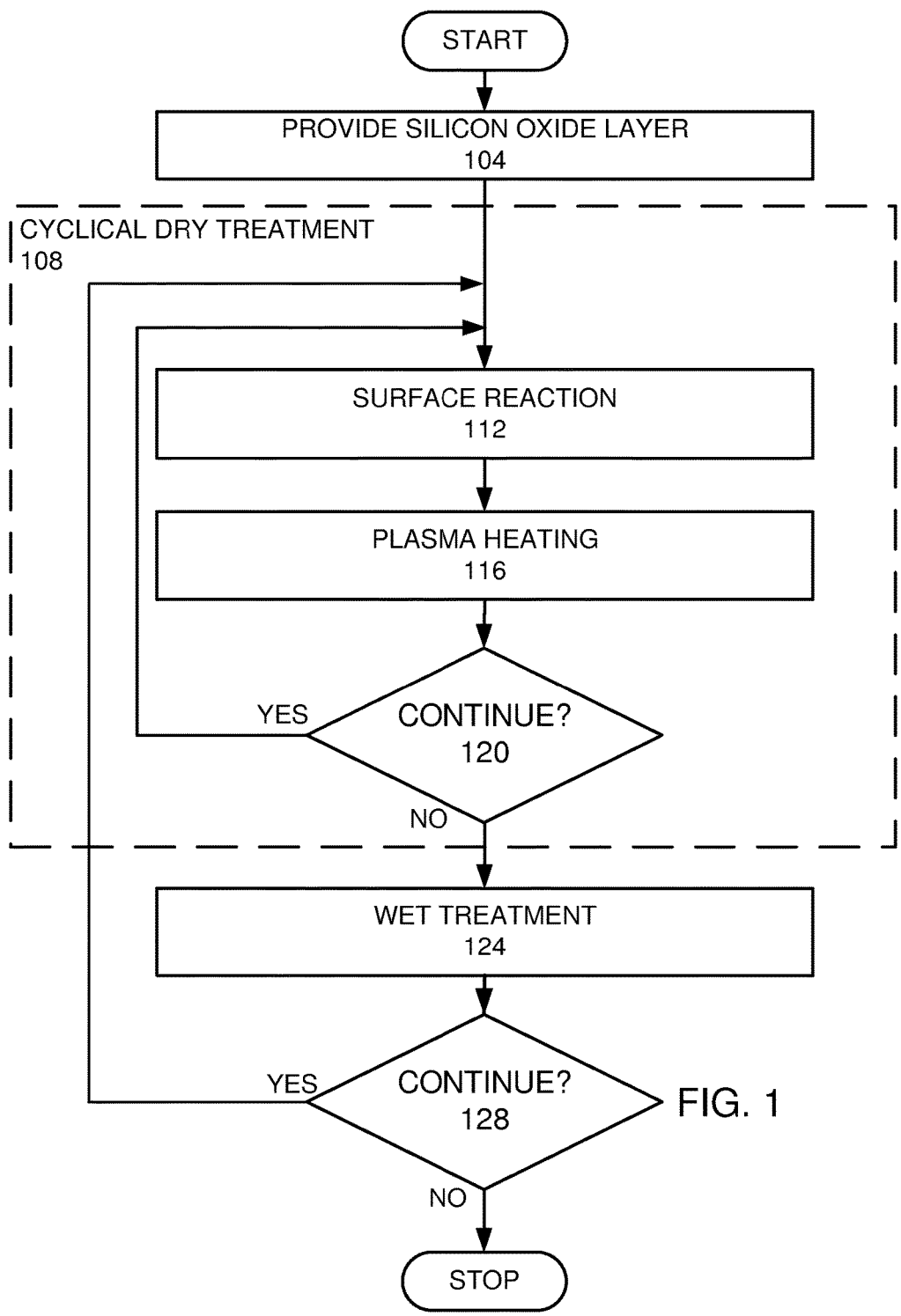
FIG. 1 is a high level flow chart of an embodiment of the invention.

To facilitate understanding, FIG. 1 is a high level flow chart of a process used in an embodiment of the invention. A substrate with a silicon oxide etch layer is provided (step 104). A cyclical dry treatment is provided (step 108). The cyclical dry treatment comprises providing a surface reaction phase (step 112) and providing a plasma heating phase (step 116). Once the cyclical dry treatment is repeated for a sufficient number of times (step 120) the cyclical dry treatment is stopped. A wet treatment is then provided (step 128). The process of the cyclical dry treatment (step 108) and wet treatment 124 are repeated until a sufficient number of cycles is completed (step 128).

EXAMPLES

Figure 2A:
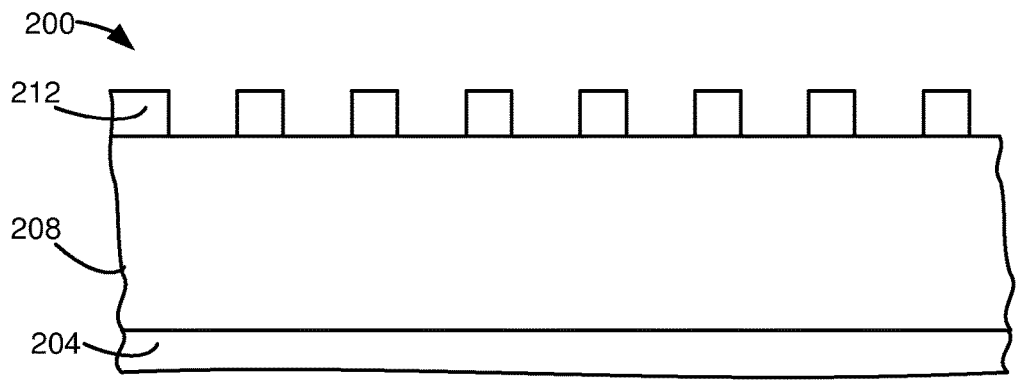
FIGS. 2A-E are schematic views of a substrate processed according to an embodiment of the invention.

In an example of a preferred embodiment of the invention, a substrate with a silicon oxide etch layer is provided (step 104). FIG. 2A is a schematic cross-sectional view of a stack 200 comprising a substrate 204 with a silicon oxide etch layer 208. In this example, a mask of silicon 212 is disposed over the silicon oxide etch layer. The stack 200 is provided to a plasma etch chamber.

Figure 3:
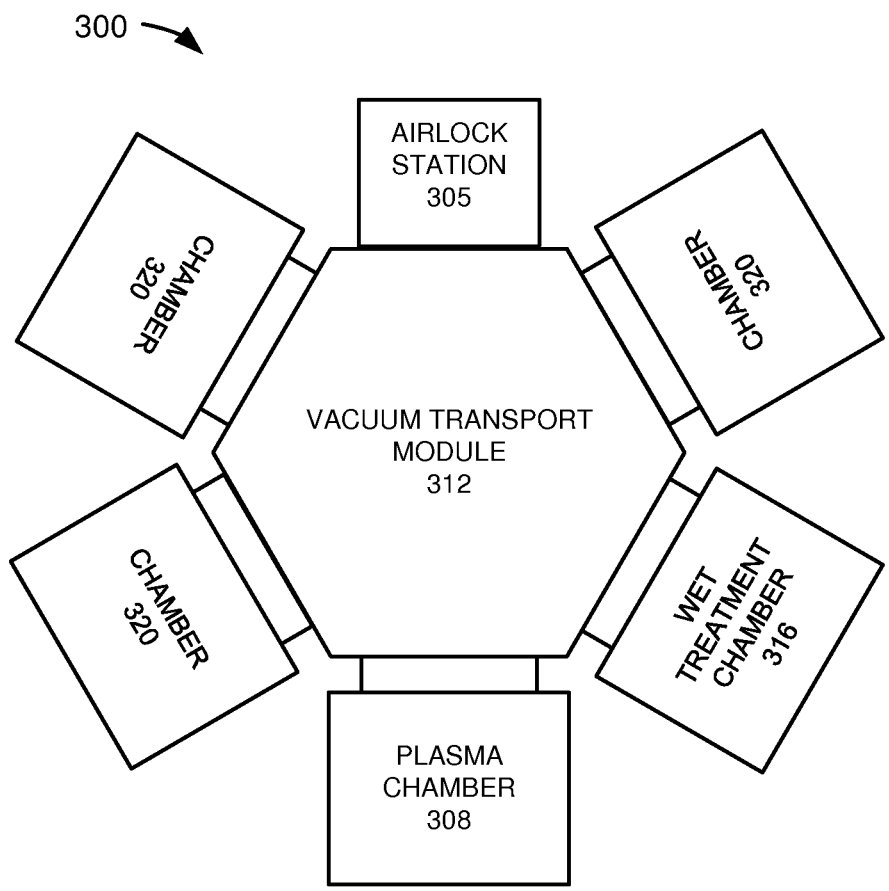
FIG. 3 is a top view of a processing tool and includes components of an embodiment of the invention.

FIG. 3 is a top view of a processing tool 300 and includes components of an embodiment of the invention. A load lock station 305 operates to transfer the wafer back and forth between the atmosphere and a vacuum of a vacuum transport module (VTM) 312. The VTM 312 is part of the processing tool 300 and connects to a plurality of processing chambers 308, 316, 320. In this embodiment, there is at least one plasma processing chamber 308 and one wet treatment chambers 316. Other processing chambers 320 may be provided and may provide other functions or may provide additional plasma processing chambers and/or wet treatment chambers.

Figure 4:
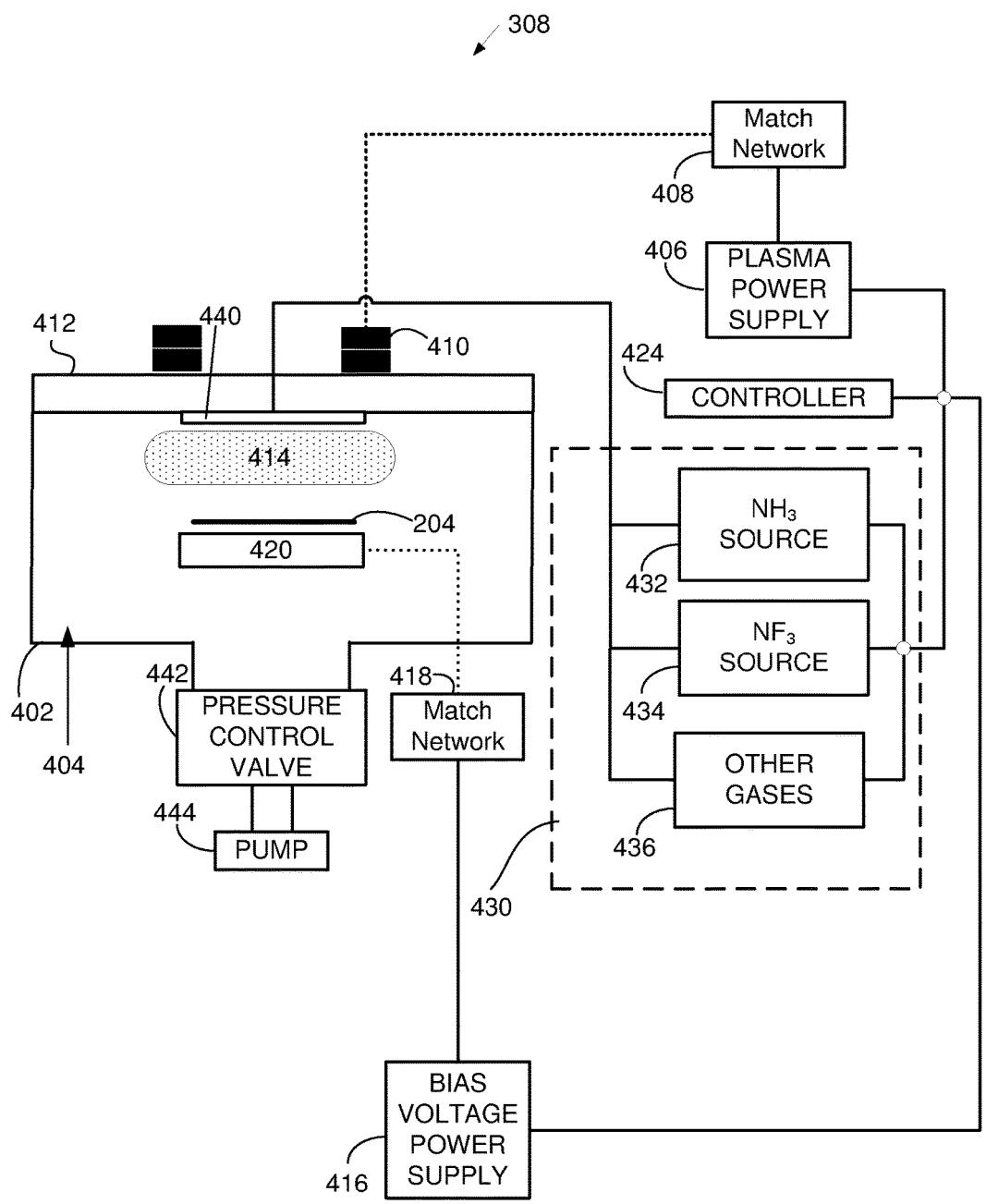
FIG. 4 is a schematic view of a plasma processing chamber that may be used in an embodiment of the invention.

FIG. 4 schematically illustrates an example of a plasma processing chamber 308 which may be used to perform the process of etching the silicon oxide etch layer in accordance with one embodiment of the present invention. The plasma processing chamber 308 includes a plasma reactor 402 having a plasma processing confinement chamber 404 therein. A plasma power supply 406, tuned by a match network 408, supplies power to a TCP coil 410 located near a power window 412 to create a plasma 414 in the plasma processing confinement chamber 404 by providing an inductively coupled power. The TCP coil (upper power source) 410 may be configured to produce a uniform diffusion profile within the plasma processing confinement chamber 404. For example, the TCP coil 410 may be configured to generate a toroidal power distribution in the plasma 414. The power window 412 is provided to separate the TCP coil 410 from the plasma processing confinement chamber 404 while allowing energy to pass from the TCP coil 410 to the plasma processing confinement chamber 404. A wafer bias voltage power supply 416 tuned by a match network 418 provides power to an electrode 420 to set the bias voltage on the substrate 204 which is supported by the electrode 420. A controller 424 sets points for the plasma power supply 406, gas source/gas supply mechanism 430, and the wafer bias voltage power supply 416.

The plasma power supply 406 and the wafer bias voltage power supply 416 may be configured to operate at specific radio frequencies such as, for example, 13.56 MHz, 27 MHz, 2 MHz, 60 MHz, 400 kHz, 2.54 GHz, or combinations thereof. Plasma power supply 406 and wafer bias voltage power supply 416 may be appropriately sized to supply a range of powers in order to achieve desired process performance. For example, in one embodiment of the present invention, the plasma power supply 406 may supply the power in a range of 50 to 5000 Watts, and the wafer bias voltage power supply 416 may supply a bias voltage of in a range of 20 to 2000 V. In addition, the TCP coil 410 and/or the electrode 420 may be comprised of two or more sub-coils or sub-electrodes, which may be powered by a single power supply or powered by multiple power supplies.

As shown in FIG. 4, the plasma processing chamber 308 further includes a gas source/gas supply mechanism 430. The gas source includes a $NH_3$ gas source 432, a $NF_3$ gas source 434, and other gas sources 436. The gas sources 432, 434, and 436 are in fluid connection with plasma processing confinement chamber 404 through a gas inlet, such as a shower head 440. The gas inlet may be located in any advantageous location in the plasma processing confinement chamber 404, and may take any form for injecting gas. Preferably, however, the gas inlet may be configured to produce a "tunable" gas injection profile, which allows independent adjustment of the respective flow of the gases to multiple zones in the plasma process confinement chamber 404. The process gases and byproducts are removed from the plasma process confinement chamber 404 via a pressure control valve 442 and a pump 444, which also serve to maintain a particular pressure within the plasma processing confinement chamber 404. The gas source/gas supply mechanism 430 is controlled by the controller 424. A Kiyo by Lam Research Corp. of Fremont, Calif., may be used to practice an embodiment of the invention.

Figure 5:
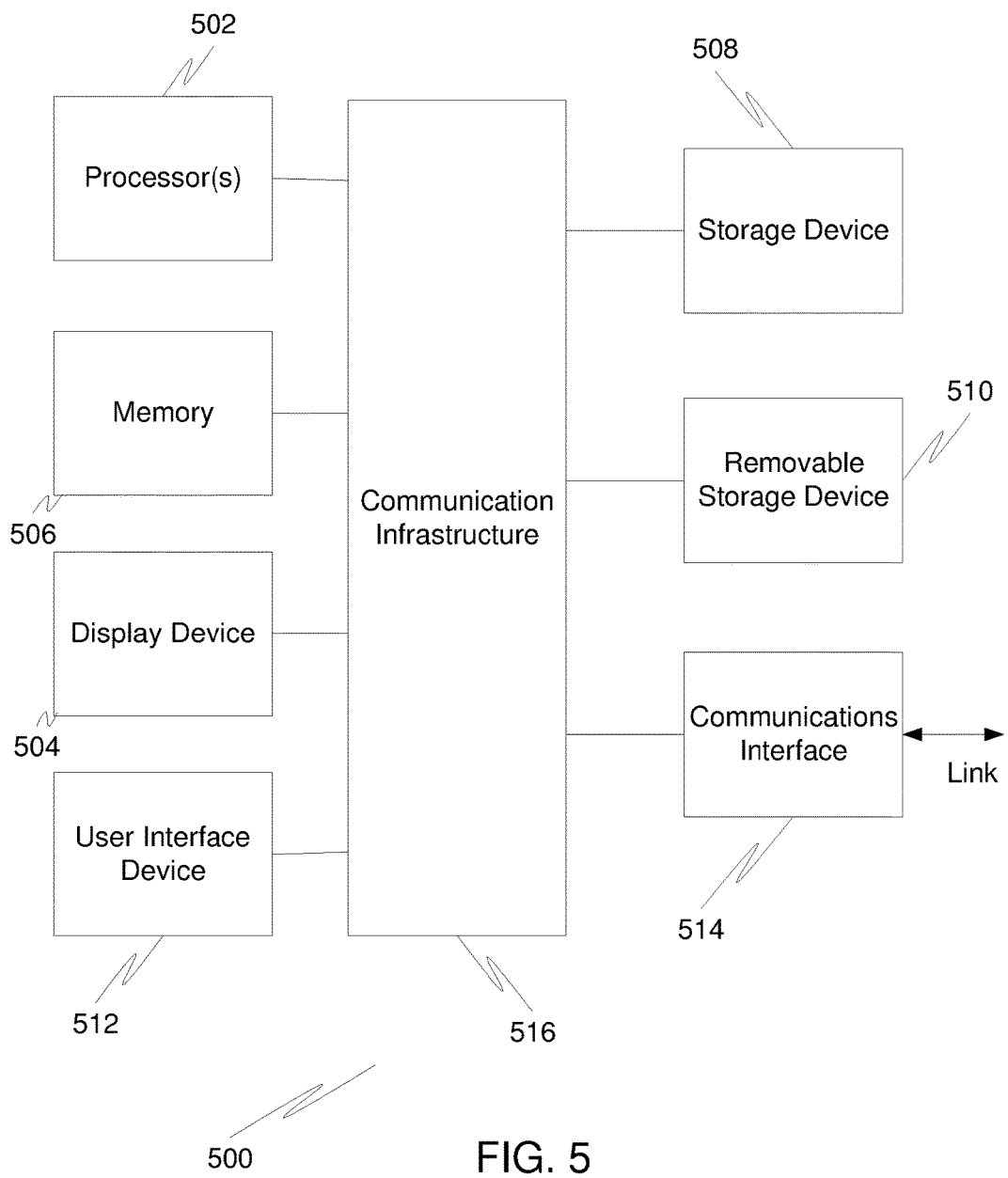
FIG. 5 is a computer system that may be used in an embodiment of the invention.

FIG. 5 is a high level block diagram showing a computer system 500, which is suitable for implementing a controller 424 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6:
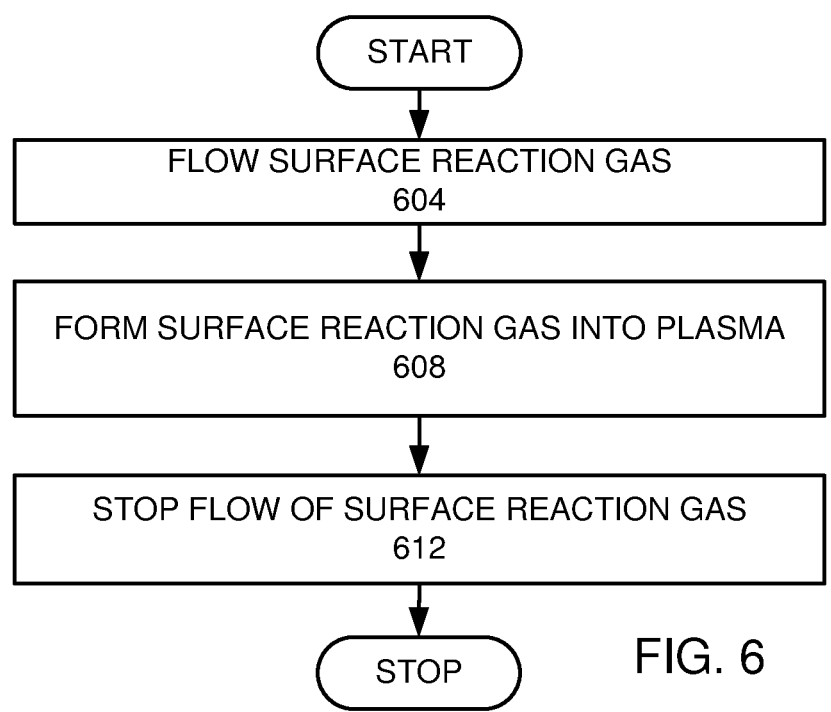
FIG. 6 is a more detailed flow chart of the surface reaction phase.

A cyclical dry treatment is provided (step 108). The cyclical dry treatment (step 108) comprises a plurality of cycles, where each cycle comprises a surface reaction phase (step 112) and a plasma heating phase (step 116). FIG. 6 is a more detailed flow chart of the surface reaction phase (step 112). The surface reaction phase (step 112) comprises flowing a surface reaction gas into the plasma processing chamber (step 604), forming the surface reaction gas into a plasma (step 608), and then stopping the flow of the surface reaction gas (step 612). In this example, the flowing of the surface reaction gas comprises flowing $NH_3$, $NF_3$, Ar, and He from the gas source 330 into the plasma processing chamber 304. The surface reaction gas is formed into a plasma (step 608). RF power is provided between 50 W to 2500 watts TCP power. The plasma processing chamber 304 pressure is maintained at 5-10000 mTorr with a temperature of −30°-120° C. The process is maintained for 2 to 20 seconds in the plasma. After this phase is completed the flow of the surface reaction gas is stopped (step 612).

Figure 2B:
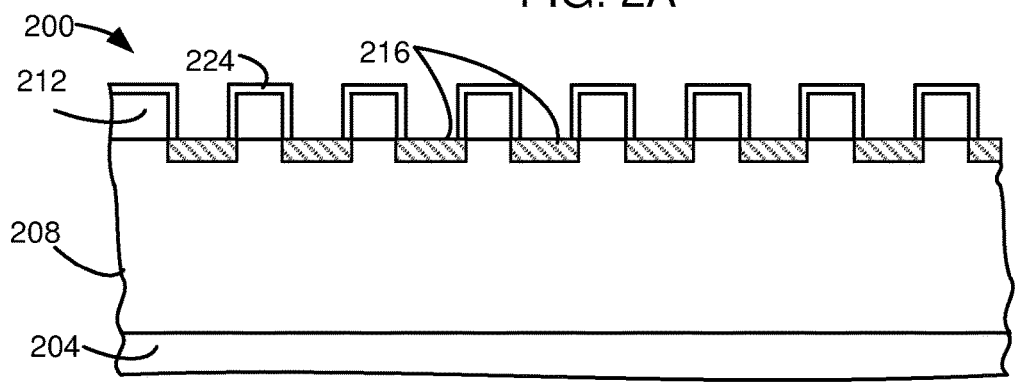

FIG. 2B is a cross-sectional view of the stack 200 after the surface reaction phase is completed. The surface reaction phase has formed the top surface of the silicon oxide etch layer 208 into a compound layer 216 comprising silicon, hydrogen, nitrogen, and fluorine. In this example, the compound comprising silicon, hydrogen, nitrogen, and fluorine is an amine containing salt, which in this example is $(NH_4)_2SiF_6$. A salt residue 224 is deposited on the tops and the sidewalls of the silicon mask 212. An example of the salt residue 224 may be $NH_4HF_2$.

Figure 7:
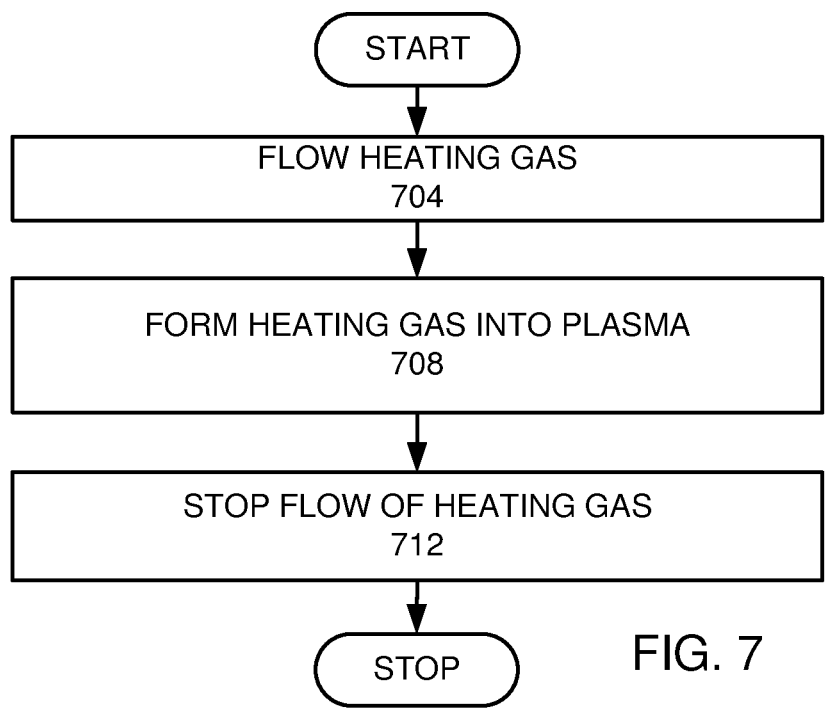
FIG. 7 is a more detailed flow chart of the plasma heating phase.

FIG. 7 is a more detailed flow chart of the plasma heating phase (step 116). The plasma heating phase (step 116) comprises flowing a heating gas into the plasma processing chamber (step 704), forming the heating gas into a plasma (step 708), and then stopping the flow of the heating gas (step 712). In this example, in this example the flowing of the heating gas comprises flowing $NH_3$ and Ar or inert dilution gases such as $N_2$, $H_2$, Ar, He, Xe, and Ne from the gas source 330 into the plasma processing chamber 304. No $NF_3$ is flowed during the plasma heating phase (step 116). The heating gas is formed into a plasma (step 708). RF power is provided at 100 W to 2500 watts TCP power. The plasma processing confinement chamber 404 pressure is controlled at 5-10000 mTorr with a temperature of −30°-120° C. The process is maintained for 1 to 60 seconds. After the 1 to 60 seconds the flow of the heating gas is stopped (step 712).

Figure 2C:
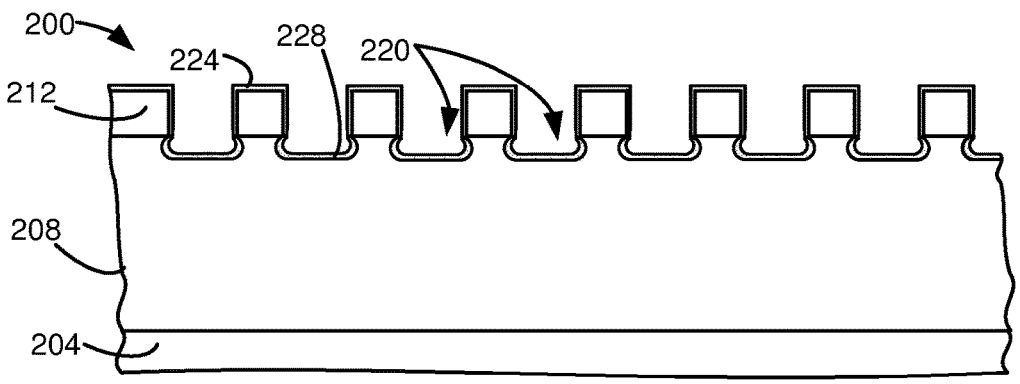

FIG. 2C is a cross-sectional view of the stack 200 after the plasma heating phase is completed. The plasma heating phase has volatized most of the compound layer, providing etch features 220. Some of the residue 228 of the compound may still remain. In this embodiment, the residue of the compound is the same as the compound, which is $(NH_4)_2SiF_6$. Amine containing salt residues 224 may also remain. As shown, a thin layer of silicon oxide may be etched for each cycle. In this example, each cycle etches between 0.1 nm to 10 nm. Preferably, 0.1 nm is etched per cycle. In this embodiment, the etch is isotropic, which causes some undercutting of the silicon mask 212.

The surface reaction phase (step 112) and the plasma heating phase (step 116) are repeated a plurality of times until the silicon oxide layer 204 is sufficiently etched (step 120). In this embodiment, it was found that after 10 cycles 4.2 nm of silicon oxide was etched. After 30 cycles 7.3 nm was etched. After 50 cycles, 9.6 nm was etched.

Figure 2D:
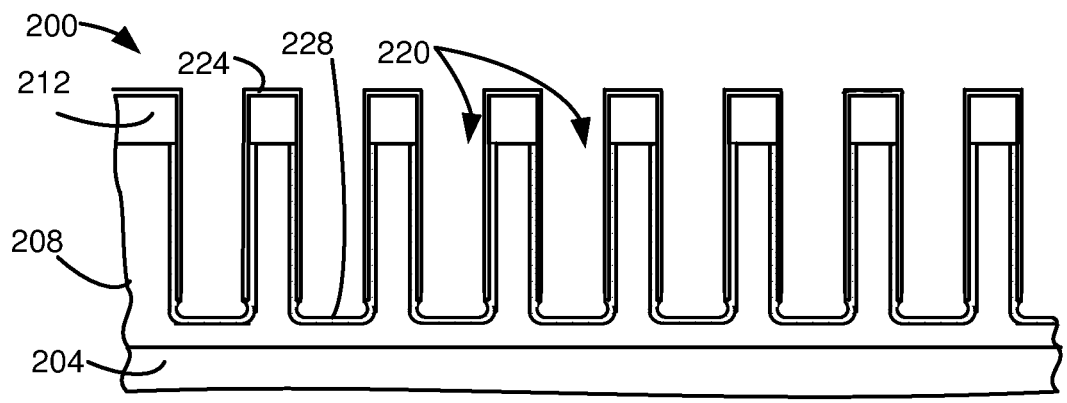

FIG. 2D is a cross-sectional view of the stack 200 after the plasma heating phase is completed after a plurality of cycles. The etch features 220 have been completely etched. Amine containing salt residues 224 and residue 228 of the compound remain.

The stack 200 is subjected to a wet treatment (step 128). In this example, the wafer 204 is transferred from the plasma chamber 308 to the wet treatment chamber 316.

Figure 8:
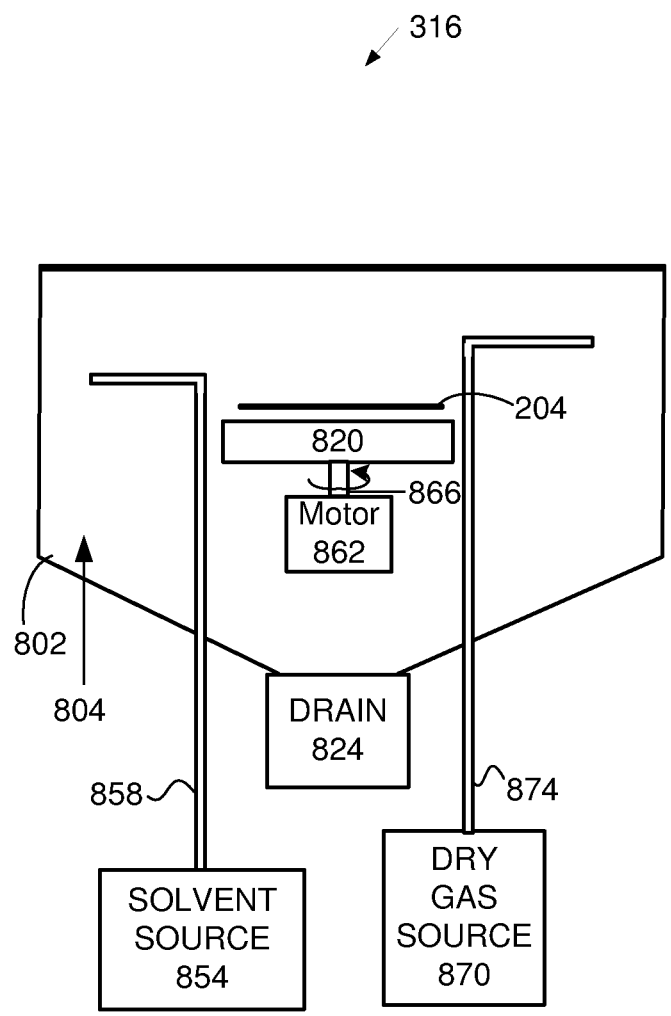
FIG. 8 is a schematic view of a wet treatment chamber.

FIG. 8 is a schematic view of a wet treatment chamber 316. The wet treatment chamber 316 comprises a solvent source 854 connected to a water inlet 858, a substrate support 820, a motor 862, an axel 866, a drying gas source 870 connected to a drying gas inlet 874, a chamber housing 802, and a drain 824. The water inlet 858 may be a rotatable arm. The substrate support 820 is connected to the motor 862 by the axel 866, to allow the motor 862 to spin the substrate support 820. The drying gas inlet 874 may also be a rotatable arm.

The solvent source 854 provides a solvent that dissolves the compound and remaining residues through the inlet 858 into the chamber housing 802, where the solvent is deposited over the substrate 204. The inlet 858 may be a rotatable arm that can control the location of the application of the solvent on the substrate 204. A drying gas may be provided from the drying gas source 870 through the drying gas inlet 874. The drying gas inlet 874 may also be a rotatable arm that controls the location of the application of the drying gas. The motor 862 may be used to spin the substrate support 820 to remove the solvent. The drain 824 removes the solvent from the chamber housing 802. Such a process would be used to remove the amine containing salt residue and residue of the compound. Other embodiments may use a chamber, such as describe in U.S. patent application Ser. No. 14/495,693, entitled "Movable Gas Nozzle in Drying Module," by Fischer et al., and filed on Sep. 24, 2014, which is incorporated by reference for all purposes.

Figure 2E:
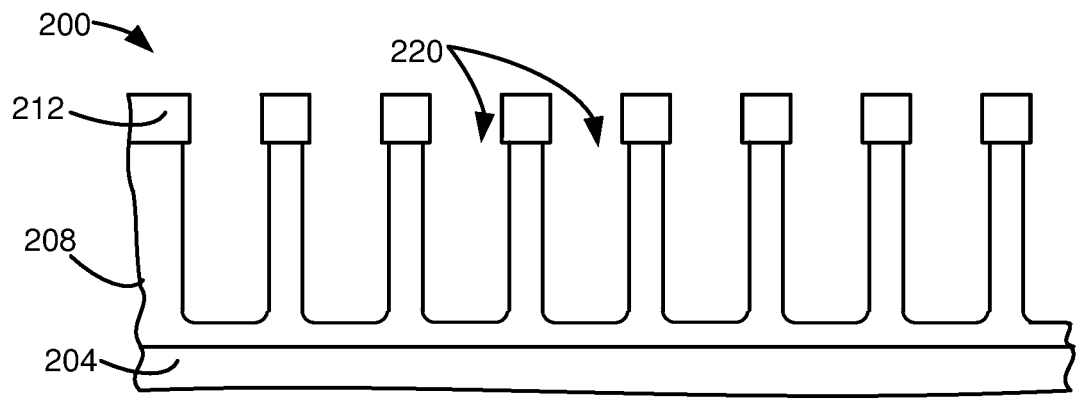

FIG. 2E is a cross-sectional view of the stack 200 after the wet treatment is completed. The etch features 220 have been completely etched. The salt residues have been removed by the wet treatment.

A determination is made on whether the process is complete (step 128). If the process is not complete, then the surface reaction phase (step 112) is repeated. In such a case, the wet treatment (step 124) may use a liquid solvent that prevents or reduces oxidation and removes the residue. Such a solvent may be a hydrophobic solvent. In various embodiments the solvents may comprise at least one of deionized water, methanol, ethanol, acetonitrile, isopropyl alcohol, dimethyl sulfoxide, acetone, N,N-dimethylformmide, polyethylene glycol, propylene glycol, hexane, acetic acid, ammonium hydroxide, or diluted hydrogen fluoride. In such a case, the wafer 204 is transferred by the vacuum transport module 312 from the wet treatment chamber 316 to the plasma chamber 308. The use of a solvent that prevents or reduces oxidation, prevents or reduces oxidation that might otherwise occur during the transfer of the wafer. The process is then repeated from the surface reaction phase (step 112).

If the process is completed (step 128), in some embodiments, the liquid solvent is deionized water. The vacuum transport module 312 removes the wafer 204 from the wet treatment chamber 316 to another processing chamber 308, 320 or removes the wafer from the processing tool 300 through the air lock station 305.

The use of plasma heating decreases process time, which increases cycle frequency. This embodiment provides high silicon etch selectivity. Embodiments also provided low device damage, high throughput, and high etch selectivity. The use of a wet treatment using a liquid solvent allows for a more complete removal of the compound.

In other embodiments of the invention, other pressures may be used. Preferably the chamber pressure is between 5 mTorr and 10 Torr. Because embodiments are able to operate at a higher pressure, it has been found that selectivity is improved with the higher pressure. More preferably the chamber pressure is between 200 mTorr and 800 mTorr. Most preferably, the chamber pressure is between 400 mTorr and 600 mTorr. Preferably, the RF power is between 50 watts and 2500 watts. More preferably, the RF power is between 100 watts and 1000 watts. Most preferably, the RF power is between 300 watts and 700 watts. Preferably, the wafer temperature is between $-30°$ C. and $120°$ C. More preferably, the wafer temperature is between $0°$ C. and $80°$ C. Most preferably, the wafer temperature is between $20°$ C. and $70°$ C. Preferably, the bias voltage is between 0 to 50 volts. More preferably, the bias voltage is between 10 to 40 volts. Most preferably, the bias voltage is between 15 to 30 volts. In other embodiments, the wet treatment may use solvents of one or more of deionized water, methanol, ethanol, acetonitrile, isopropyl alcohol, dimethyl sulfoxide, acetone, N,N-dimethylformamide, polyethylene glycol, or propylene glycol, hexane, acetic acid, ammonium hydroxide, diluted hydrogen fluoride.

In various embodiments, the surface reaction gas may be of different gas mixtures. Generally, the surface reaction gas comprises components with hydrogen, nitrogen, and fluorine. More preferably, the surface reaction gas comprises $NF_3$ or HF along with $H_2$, $N_2$ or $NH_3$. Most preferably, the surface reaction gas further comprises at least one noble gas. Preferably, the ratio of $NF_3$ to $NH_3$ is between 2:1 and 1:20. More preferably, the ratio of $NF_3$ to $NH_3$ is between 1:1 and 1:10. During the plasma heating the ratio of inert noble gas to $NH_3$ is from 10:1 to 300:1.)

Preferably, the cyclical dry treatment is performed for at least 5 cycles. More preferably, the cyclical dry treatment is performed for at least 10 cycles. Various embodiments provide a saturation because some of the steps are near self limiting. These embodiments may reduce loading, and provide precise control of etch depth for each cycle. In some embodiments, the surface reaction phase and the plasma heating phase are performed sequentially and not simultaneously, so that there is no overlap during each phase.

In other embodiments, a capacitively couple plasma processing chamber may be used. In other embodiments, the cyclical dry treatment (step 108) and the wet treatment (step 124) are performed in the same chamber.

In an embodiment, the plasma heating phase (step 116) is not provided. Instead, a surface reaction phase (step 112) and a wet treatment (step 124) are cyclically repeated a plurality of times. In such an embodiment, the wafer 204 is transferred between the plasma chamber 308 and the wet treatment chamber 316 for each step. In such processes, multiple plasma chambers 308 or wet treatment chambers 316 may be used, so that the same plasma chamber 308 or wet treatment chamber 316 do not need to be used during different cycles. As mentioned above, the non-final wet treatments may use a solvent comprising at least one of deionized water, methanol, ethanol, acetonitrile, isopropyl alcohol, dimethyl sulfoxide, acetone, N,N-dimethylformmide, polyethylene glycol, propylene glycol, hexane, acetic acid, ammonium hydroxide, or diluted hydrogen fluoride. In this embodiment, the final wet treatment uses deionized water. In other embodiment, other solvents are used during the final wet treatment.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for selectively etching silicon oxide, comprising:
    providing a surface reaction phase, comprising:
        flowing a surface reaction gas comprising hydrogen, nitrogen and fluorine containing components;
        forming the surface reaction gas into a plasma to form silicon oxide into a compound layer comprising silicon, hydrogen, nitrogen, and fluorine;
        heating the plasma by,
            flowing a heating gas, wherein the heating gas comprises $H_2$ or $N_2$ or $NH_3$, and wherein the heating gas is $NF_3$ and HF free;
            forming the heating gas into a plasma; and
            stopping the flow of the heating gas;
    stopping the flow of the surface reaction gas; and
    wet treating the surface to remove the compound layer;
    wherein the surface reaction gas comprises: $NF_3$ or HF; and $H_2$ or $N_2$ or $NH_3$; and the compound is an amine containing salt.

2. The method, as recited in claim 1, wherein the surface reaction gas comprises $NF_3$ and $NH_3$ and wherein the heating gas comprises $NH_3$ and is free of $NF_3$.

3. The method, as recited in claim 2, wherein the providing the surface reaction phase and providing the plasma heating phase make up a dry treatment, wherein the dry treatment is repeated cyclically a plurality of times.

4. The method, as recited in claim 3, wherein the dry treatment is performed at a pressure of at least 5 mTorr.

5. The method, as recited in claim 4, wherein the surface reaction gas and the heating gas both further comprise flowing a noble gas.

6. The method, as recited in claim 5, wherein a continuous plasma is maintained during the cyclically repeated dry treatment.

7. The method, as recited in claim 1, wherein providing the surface reaction and wet treating the surface are cyclically repeated a plurality of times.

8. The method, as recited in claim 7, wherein the wet treating uses a hydrophobic solvent that is able to dissolve the compound layer without oxidizing silicon.

9. The method, as recited in claim 1, wherein the wet treating uses a solvent that is able to dissolve the compound layer without oxidizing silicon.

* * * * *